(12) United States Patent
Carter et al.

(10) Patent No.: US 8,674,606 B2
(45) Date of Patent: Mar. 18, 2014

(54) DETECTING AND PREVENTING INSTABILITIES IN PLASMA PROCESSES

(75) Inventors: Daniel Carter, Fort Collins, CO (US); Victor Brouk, Fort Collins, CO (US); Jeff Roberg, Longmont, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 277 days.

(21) Appl. No.: 12/766,913

(22) Filed: Apr. 25, 2010

(65) Prior Publication Data

US 2010/0270141 A1 Oct. 28, 2010

Related U.S. Application Data

(60) Provisional application No. 61/173,116, filed on Apr. 27, 2009.

(51) Int. Cl.
- *H01J 7/24* (2006.01)
- *H05B 31/26* (2006.01)
- *H03B 1/00* (2006.01)

(52) U.S. Cl.
USPC ........................................ 315/111.21; 331/74

(58) Field of Classification Search
USPC ................................................... 315/111.21
See application file for complete search history.

(56) References Cited

U.S. PATENT DOCUMENTS

| 5,195,045 | A | 3/1993 | Keane et al. |
| 5,441,596 | A | 8/1995 | Nulty |
| 5,556,549 | A | 9/1996 | Patrick et al. |
| 5,643,364 | A | 7/1997 | Zhao et al. |
| 5,747,935 | A | 5/1998 | Porter et al. |
| 5,815,047 | A | 9/1998 | Sorensen et al. |
| 5,842,154 | A | 11/1998 | Harnett |
| 5,929,717 | A | 7/1999 | Richardson et al. |
| 5,936,481 | A | 8/1999 | Fujii |
| 6,046,546 | A | 4/2000 | Porter et al. |
| 6,259,334 | B1 | 7/2001 | Howald |
| 6,305,316 | B1 | 10/2001 | DiVergilio et al. |

(Continued)

FOREIGN PATENT DOCUMENTS

| EP | 0731559 A1 | 9/1996 |
| EP | 0752757 A | 1/1997 |
| EP | 1702344 | 9/2006 |
| WO | 9827646 A1 | 6/1998 |
| WO | 2005066991 A1 | 7/2005 |

OTHER PUBLICATIONS

Descoeudres, A., et al., "Attachment-Induced Ionization Instability in Electronegative Capacitive RF Discharges", "Plasma Sources Sci. Technol.", Mar. 4, 2003, pp. 152-157, vol. 2003, No. 12, Publisher: Inst. of Physics Publishing Ltd., Published in: GB.

(Continued)

*Primary Examiner* — Douglas W Owens
*Assistant Examiner* — Dedei K Hammond
(74) *Attorney, Agent, or Firm* — Neugeboren O'Dowd PC

(57) ABSTRACT

Systems, methods and apparatus for reducing instabilities in a plasma-based processing system are disclosed. An exemplary method includes applying power to a plasma with a power amplifier; determining whether low frequency instability oscillations are present or high frequency instability oscillations are present in the plasma; and altering, based upon whether high or low frequency instability oscillations are present, an impedance of a load that is experienced by the power amplifier, the load experienced by the power amplifier including at least an impedance of the plasma.

12 Claims, 13 Drawing Sheets

(56) References Cited

U.S. PATENT DOCUMENTS

| | | | |
|---|---|---|---|
| 6,313,584 B1 | 11/2001 | Johnson et al. | |
| 6,392,210 B1* | 5/2002 | Jewett et al. | 219/663 |
| 6,399,507 B1 | 6/2002 | Nallan et al. | |
| 6,631,693 B2 | 10/2003 | Hilliker et al. | |
| 6,703,080 B2* | 3/2004 | Reyzelman et al. | 427/445 |
| 6,777,881 B2 | 8/2004 | Yuzurihara et al. | |
| 6,791,274 B1* | 9/2004 | Bhutta et al. | 315/111.21 |
| 6,838,832 B1 | 1/2005 | Howald et al. | |
| 6,887,339 B1* | 5/2005 | Goodman et al. | 156/345.28 |
| 6,920,312 B1* | 7/2005 | Benjamin | 455/69 |
| 7,157,857 B2 | 1/2007 | Brouk et al. | |
| 7,489,206 B2* | 2/2009 | Kotani et al. | 331/74 |
| 7,839,223 B2* | 11/2010 | Van Zyl et al. | 331/35 |
| 8,018,164 B2* | 9/2011 | Shannon et al. | 315/111.21 |
| 2002/0179247 A1 | 12/2002 | Davis et al. | |
| 2003/0098127 A1 | 5/2003 | Nakano | |
| 2005/0134186 A1* | 6/2005 | Brouk et al. | 315/111.21 |
| 2006/0262889 A1* | 11/2006 | Kalvaitis et al. | 375/355 |
| 2007/0107844 A1* | 5/2007 | Bullock et al. | 156/345.28 |

OTHER PUBLICATIONS

Goodman, D.L., et al., "Active Control of Instabilities for Plasma Processing with Electronegative Gases", "J. of Physics D: Applied Physics", Oct. 30, 2003, pp. 2845-2852, vol. 2003, No. 36, Publisher: Inst. of Physics Publishing Ltd., Published in: GB.

Lieberman, M.A., et al., "Instabilities in Low-Pressure Inductive Discharges with Attaching Gases", "Applied Physics Letters", Dec. 6, 1999, pp. 3617-3619, vol. 75, No. 23, Publisher: Am. Inst. of Physics.

Hochstrasser, M., "Supplementary European Search Report re Application No. EP 04813872, PCT/US2004/041616", Jul. 28, 2008, p. 5, Published in: EP.

Wittmann-Regis, Agnes, "International Preliminary Report on Patentability re Application PCT/US2010/032332", Nov. 1, 2011, p. 8, Published in: CH.

Sebastian, Joseph, "International Search Report and Written Opinion dated Jun. 7, 2010 in PCT application No. PCT/US10/032332", Jun. 7, 2010, Published in: AU.

* cited by examiner

DETECTING AND PREVENTING INSTABILITIES IN PLASMA PROCESSES

FIELD OF THE INVENTION

This invention relates generally to plasma processing systems, and more particularly to apparatus and methods for stabilizing interactions between plasmas and power delivery systems.

BACKGROUND OF THE INVENTION

Plasma processing systems are widely used in a variety of industries for modifying the surface properties of materials. For example, the manufacture of modern integrated circuits generally involves many processing steps that use plasmas for etching of submicrometer features, and/or for depositing atomically thin layers of materials.

A typical plasma processing system comprises a processing chamber and a power delivery system that creates and maintains the plasma inside the chamber. Electrically, the plasma is a load with a characteristic impedance that is affected by the power generator. And in addition, the impedance of a processing plasma may vary depending upon process conditions or other variables. Variations in plasma impedance may adversely affect the power delivery from the generator, which typically provides optimal power delivery only for a particular load impedance. These variations may also result in undesired drifts or perturbations in process variables, such as etch or deposition rates, due to changes in the physical properties of the plasma at different power levels. As a result, plasma processing systems are often equipped with impedance matching and control mechanisms or circuitry that respond to changes in plasma impedance and maintain desired levels of power delivery to the plasma.

As film thicknesses and feature sizes continually shrink, plasma sources and processes also must evolve in order to deliver the control and precision needed for new and next generation devices and coatings. Power delivery is becoming increasingly critical in RF driven systems as trends continue toward lower pressures, lower powers and larger electrode areas. Especially in etching and deposition processes, commonly using electronegative species, the combined effects of low pressure, low power density and electro-negativity often lead to increased risk of plasma instabilities.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

In accordance with one embodiment, the invention may be characterized as a method for reducing instabilities in a plasma-based processing system. The method in this embodiment includes applying power to a plasma with a power amplifier; determining whether low frequency instability oscillations are present or high frequency instability oscillations are present in the plasma; and altering, based upon whether high or low frequency instability oscillations are present, an impedance of a load that is experienced by the power amplifier, the load experienced by the power amplifier including at least an impedance of the plasma.

In another embodiment, the invention may be characterized as a system for reducing instabilities in a plasma-based processing system, the system comprising: a power amplifier configured to apply power to a plasma processing chamber to ignite and sustain a plasma; a sensor configured to sense at least one characteristic of power that is output from the power amplifier; a stability controller configured to determine, based upon the at least one characteristic of power, whether low frequency instability oscillations are present or high frequency instability oscillations are present in the plasma, and responsive to the determination of whether low frequency instability oscillations are present or high frequency instability oscillations are present in the plasma, the stability controller controls a load impedance that is experienced by the power amplifier.

In yet another embodiment, the invention may be characterized as an apparatus for reducing instabilities in a plasma-based processing system, the apparatus includes a measurement component configured to provide measurements of power that is output by a power amplifier; an instability detection component configured to receive a representation of the measurements and provide a signal indicative of whether low or high frequency oscillations are present in the plasma; a frequency controller in communication with the instability detection component, the frequency controller configured to generate, based upon the frequency of any instability, a frequency control signal which controls an output frequency of an amplifier so that the frequency of power that is output by the amplifier alters an impedance of a load experienced by the amplifier so as to reduce any instabilities in the plasma-based processing system.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings where like or similar elements are designated with identical reference numerals throughout the several views and wherein:

DETAILED DESCRIPTION

Figure 1:
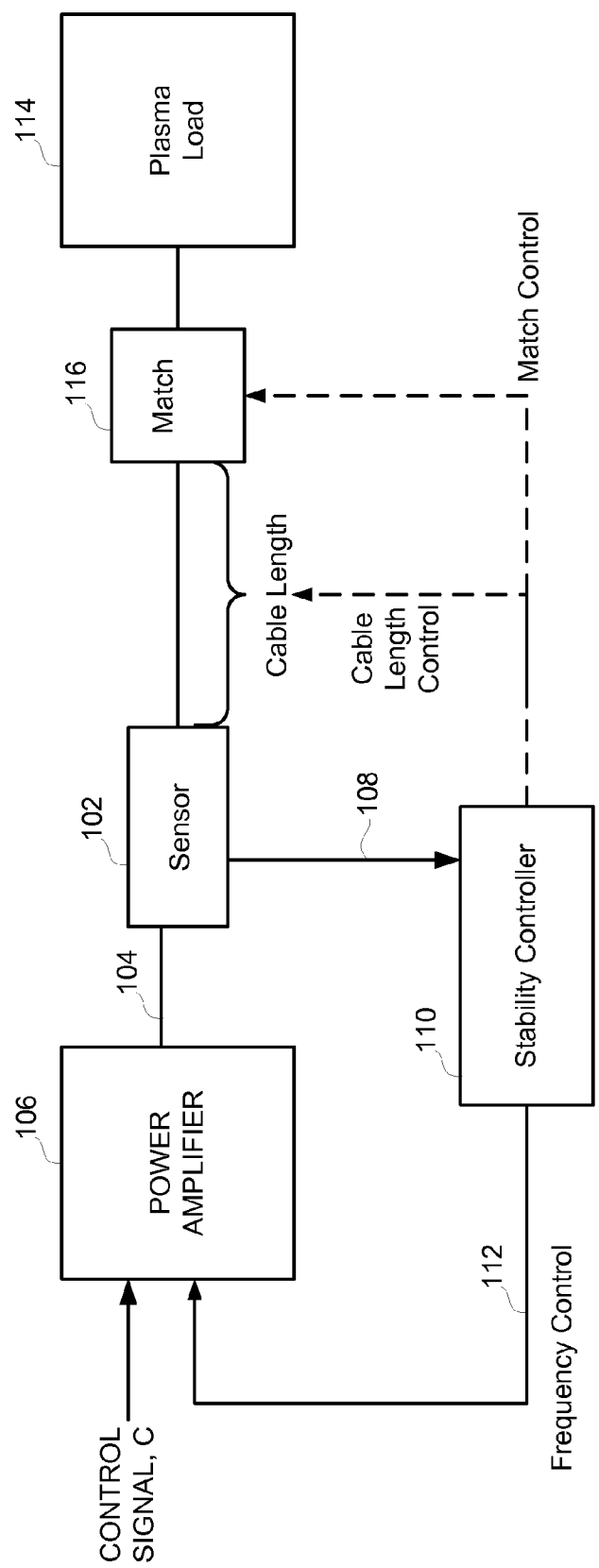
FIG. 1 illustrates a block diagram of a plasma processing system in accordance with one implementation of the present invention.

Referring to FIG. 1, shown is a block diagram depicting an exemplary embodiment of the present invention. As shown, a sensor 102 is disposed at an output 104 of a power amplifier 106 (e.g., a switch-mode power amplifier) to provide an output 108 that includes an indication of one or more power characteristics to a stability controller 110. And based upon the sensor output 108, the stability controller 110 is generally configured to provide a frequency-control-signal 112 to the power amplifier 106 that controls the frequency of the amplifier 106 so as to prevent or remove an instability in a plasma load 114. In an alternative embodiment, the stability controller 110 is configured, responsive to the output 108 of the sensor 102, to control a cable length (depicted by the broken line connecting the stability controller 110 to the cable length) to prevent or remove an instability from the plasma load 114. And in yet another embodiment, the stability controller 110 is configured to control the match 116 (depicted by the broken line connecting the stability controller to the cable length) to prevent or remove an instability from the plasma load 114.

In many embodiments, the stability controller 110 is configured to determine, based upon the output of the sensor 102, the type of instability that is present in the plasma 114 and provide an output 112 that is tailored to prevent or remove the particular type of plasma instability. In many implementations for example, the stability controller generally operates to stabilize plasma oscillations by favorably aligning the impedance trajectories of the plasma 114 and the amplifier 106. In some embodiments for example, the stability controller 110 determines the type of instability that is present in the plasma 114, and in response, controls the frequency of the amplifier 106 so as to align the impedance trajectories of the plasma 114 and the amplifier 106. In alternative embodiments, the cable length is controlled to so as to align the impedance trajectories of the plasma 114 and the amplifier 106. And in yet another embodiment, the match 116 is controlled so as to align the impedance trajectories of the plasma 114 and the amplifier 106. Additional details relating to aligning the angle of the impedance trajectory of the plasma 114 with a contour of constant power output by the amplifier 106, and details relating to adjusting a match to modify the impedance trajectory of the plasma 114, are found in commonly assigned U.S. Pat. No. 7,157,857, issued Jan. 2, 2007, to Brouk et al., which is incorporated herein by reference.

Figure 2:
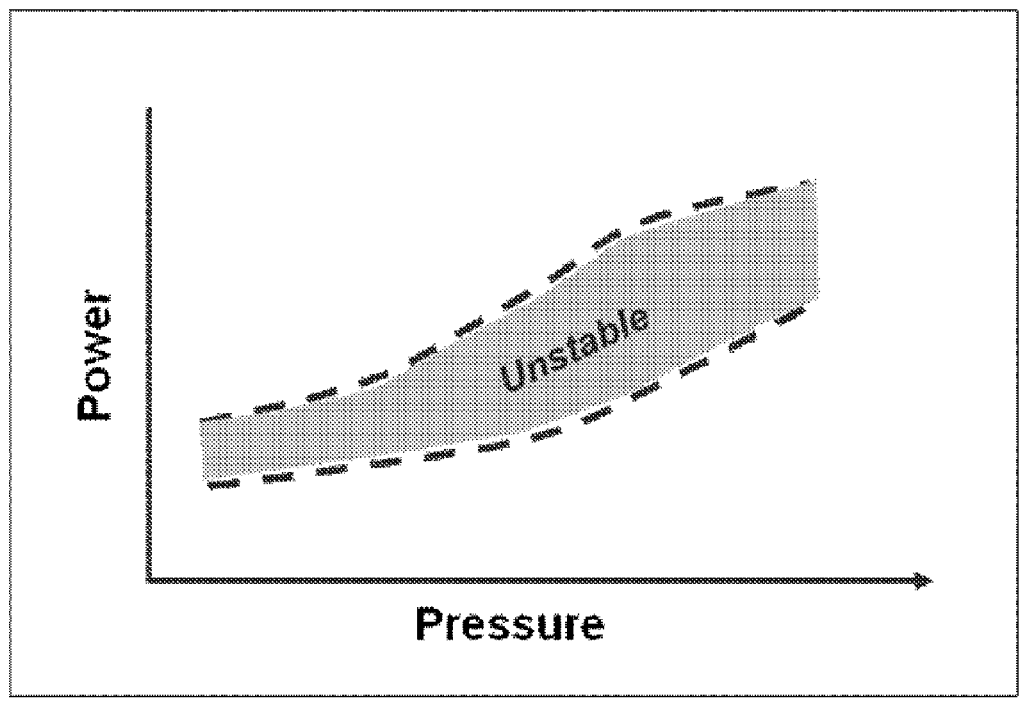
FIG. 2 is a graph depicting an unstable region that may occur between a high power inductively coupled plasma mode and a low power capacitively coupled plasma mode.

Referring next to FIG. 2, it has been found that instabilities occur in inductively coupled systems between stable low density (capacitive) and stable high density (inductive) modes. These behaviors typically occur in the 5-100 mTorr pressure range and at powers generally below about 1.5 watt/cm$^2$ (electrode area). Within this region oscillation in particle density, optical emission and coil voltage have been observed. Instabilities can also occur in capacitively coupled plasmas where electron attachment to electronegative species has been found to cause similar oscillatory behavior.

Figures 3A, 3B:
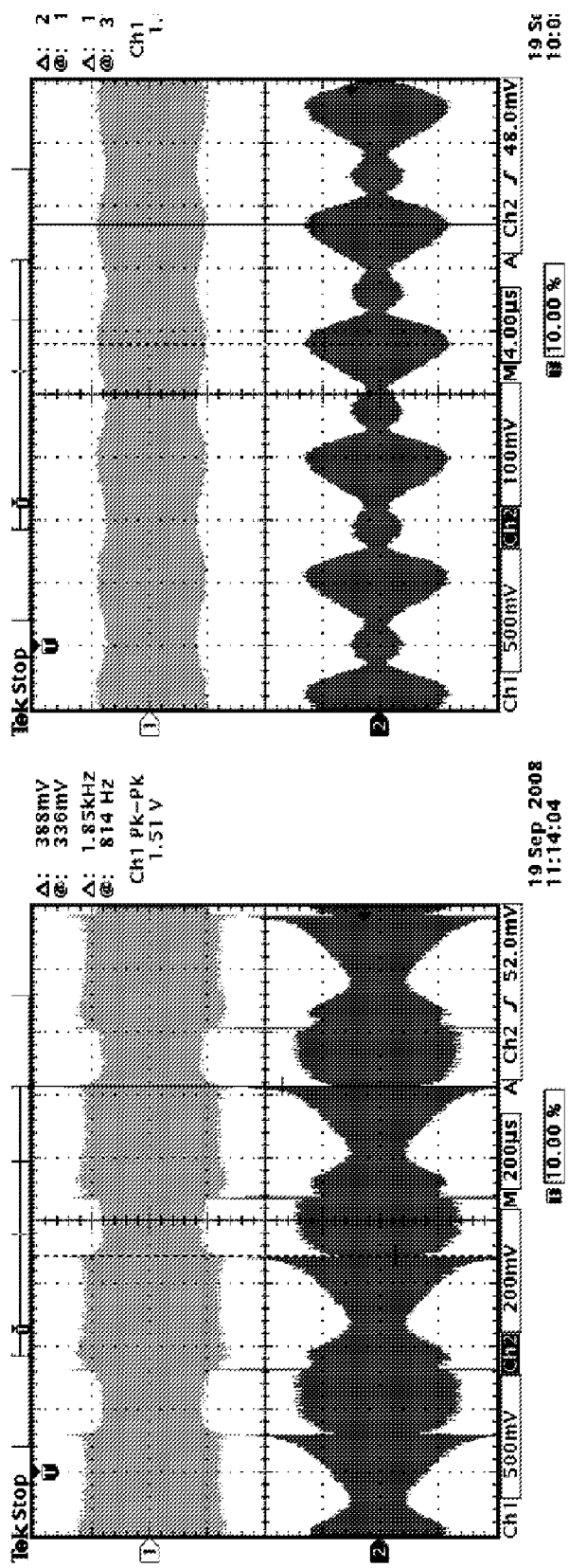
FIGS. 3A and 3B are graphs depicting forward and reflected power captured in the presence of plasma instabilities with oscillation frequencies of about 1.85 kHz and 132 kHz, respectively.
Figure 4B:
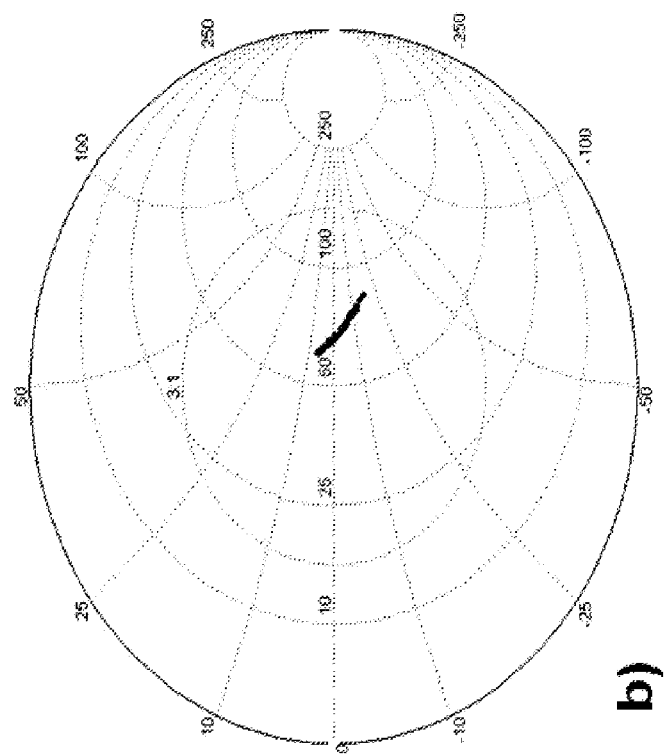
FIGS. 4A and 4B are Smith charts depicting impedance trajectories of a low frequency instability and a high frequency instability, respectively.
Figure 4A:
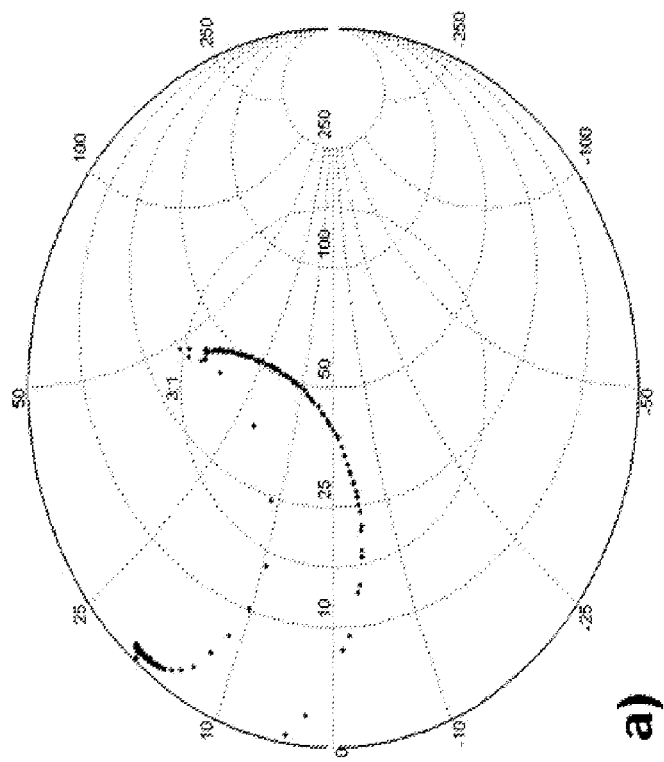

Depending on many factors, the nature of instability can vary dramatically. Severe instabilities can cause noticeable flicker in plasma intensity but less acute cases can go unnoticed. Oscillations can drive sudden and rapid changes in plasma impedance with frequencies ranging from a few hundred hertz to well over 100 kHz. Referring next to FIGS. 3A and 3B, shown are plasma oscillation instabilities of 1.85 kHz and 132 kHz, respectively, captured in both forward (Ch1) and reflected power (Ch2). FIGS. 4A and 4B are Smith charts depicting examples of instability impedance trajectories of a low frequency instability and a high frequency instability, respectively. It is noted that low frequency instabilities often result in dramatic swings in impedance with large hysteresis (as depicted in FIG. 4A), while high frequency trajectories are often smaller in amplitude and tend to be smooth in nature (as depicted in FIG. 4B).

In general, power delivery to the plasma 114 plays an important role since dynamic load sensitivity can influence the amplifier's 106 susceptibility to instabilities. Many modern power topologies offer numerous advantages including improved efficiency, compact size and low cost, but one disadvantage can be increased risk of plasma instabilities. Especially for high efficiency, switch mode amplifiers, generator-plasma interaction can both promote the formation and increase the severity of plasma instabilities.

Generator-Plasma Interaction

Figure 5A:
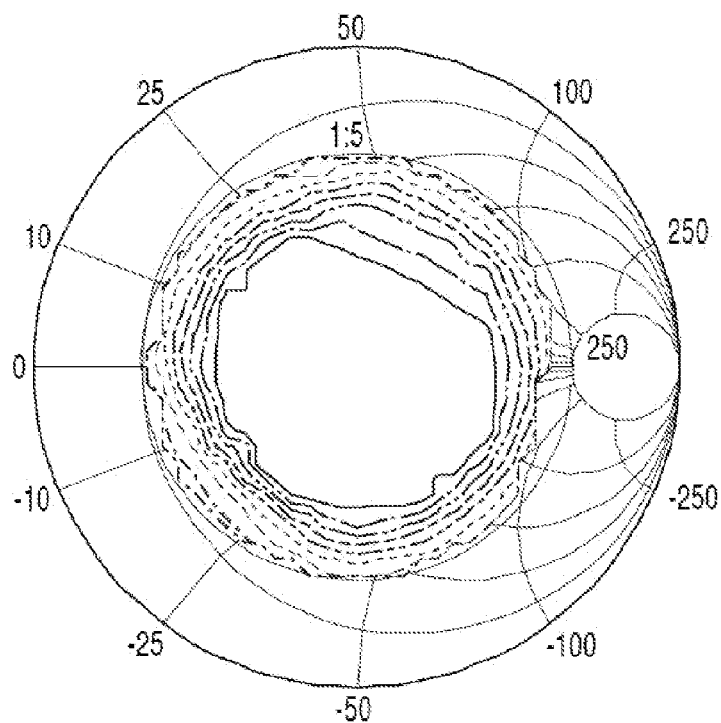
FIGS. 5A and 5B are Smith charts depicting output power, in terms of deviation from a set point, for a generator operating in a closed loop (active power regulation mode) and a generator operating in an open loop (without regulation), respectively.
Figure 5B:
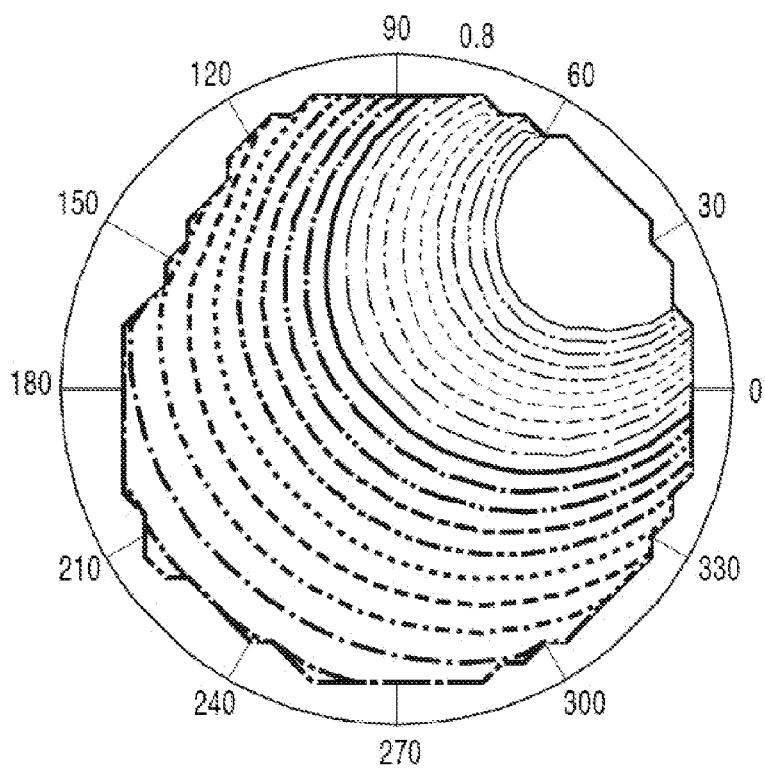

FIGS. 5A and 5B are Smith charts depicting output power, in terms of deviation from a set point, for a generator operating in a closed loop (active power regulation mode) and a generator operating in an open loop (without regulation), respectively. Data depicted in FIG. 5A was collected under active power regulation and shows the output profile centered at 50 ohms load impedance. Data in FIG. 5B was collected with no active power regulation (open-loop) showing the center of the profile well removed from 50 ohms. The centered profile in FIG. 5A is easily achieved in normal plasma conditions, where typically, slow impedance changes are accounted for by the generator's control loop. FIG. 5B is more indicative of the instantaneous output from the generator when experiencing rapid changes in impedance (such as those associated with instabilities) that are outside the bandwidth of the control loop.

Figure 6A:
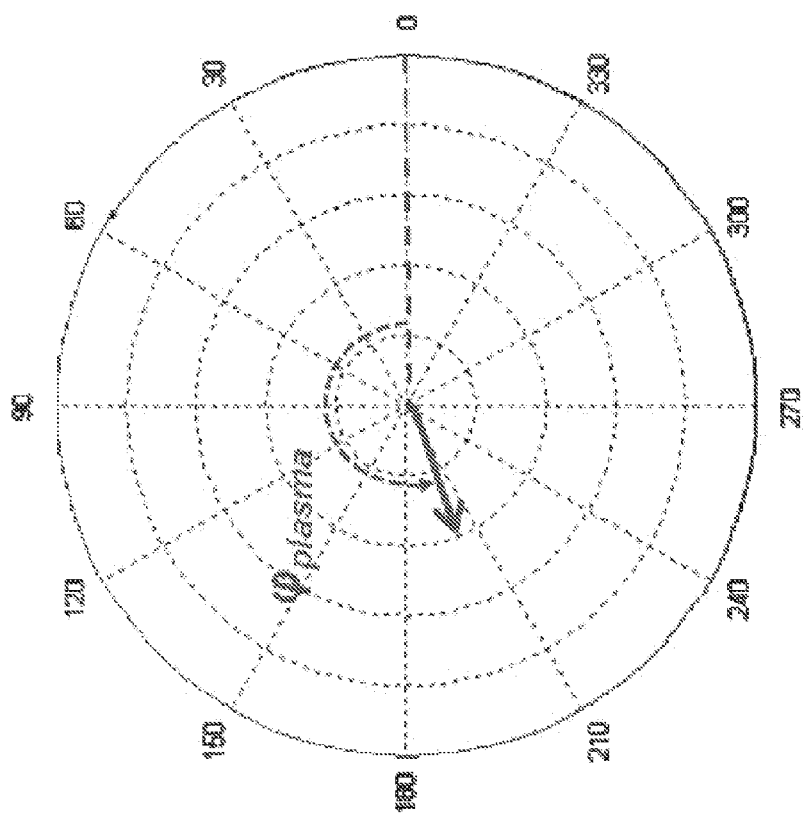
FIGS. 6A and 6B are Smith charts depicting generator gain and plasma gain, respectively.
Figure 6B:
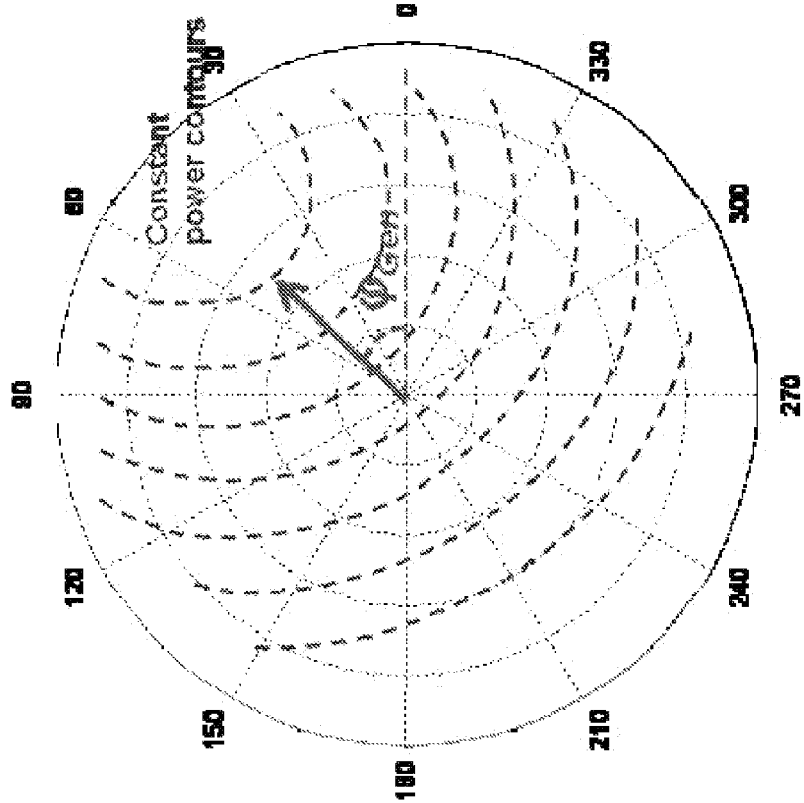

The dynamic response of a generator's output (generator gain) indicates its inherent sensitivity to impedance perturbations, including plasma instabilities, and can be represented as a vector in the complex impedance plane. Important for the interaction with plasma, the generator gain or $G_{Gen}$ is a complex number or vector having both direction and magnitude components (see, e.g., FIG. 6A). In turn, the sensitivity of the plasma's impedance to changes in applied power can be similarly represented as the plasma gain (Gplasma) also having a magnitude and direction in impedance space as depicted in FIG. 6B, which depicts plasma gain Gplasma as translated through the match and transmission cable.

The effects of the generator-plasma interaction are a function of the magnitudes of the gain factors and the vector angles φ. The orientation of $\phi_{Plasma}$ with respect to $\phi_{Gen}$ strongly influences the overall system gain, $G_{sys}$:

$$G_{Sys}=|G_{Gen}|*|G_{Plasma}|*\cos\theta \qquad \text{Eq. 1}$$

where θ is the difference between the $\phi_{Plasma}$ and $\phi_{Gen}$ angles. For a given generator $G_{Gen}$ is essentially constant. $G_{Plasma}$, however, is influenced by process conditions and external components as will be described further herein. It should be noted that when $G_{sys}$ exceeds unity, the system is at risk of becoming unstable.

Figure 7:
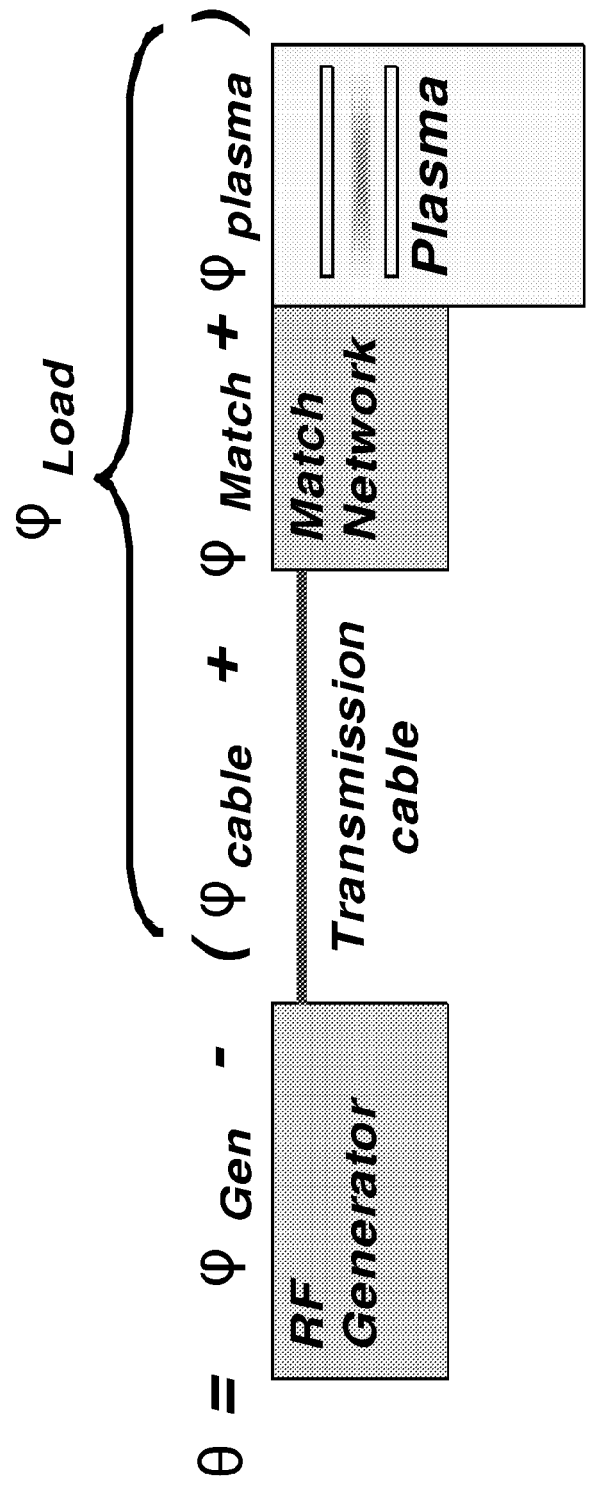
FIG. 7 is a block diagram depicting components that contribute to an angle, $\theta$, which is the difference between the $\phi_{Plasma}$ and $\phi_{Gen}$ angles.

To properly account for all contributions, the trajectory angle of the plasma impedance may be represented as $\phi_{Load}$ (and $G_{Plasma}$ as $G_{Load}$) because when referenced from the generator, $\phi_{Plasma}$ is translated through the match network and transmission cable, both typical components in the RF delivery path. Each element in the delivery path contributes to the angle $\phi_{Load}$, and as depicted in FIG. 7, in turn the resulting θ. This point highlights the impact transmission cable length has on θ and its resulting influence on system gain and ultimately plasma stability.

As discussed above, adjusting transmission line length is one technique for avoiding plasma instabilities. In practical terms, cable length affects transmission delay which translates to trajectory rotation, or change of $\phi_{Load}$. This has a direct impact on the cos θ term in Equation 1 and therefore is on approach for improving plasma stability. Proper adjustment of cable length can favorably affect θ resulting in decreased system gain. Unfortunately, operating conditions can affect both magnitude and angle of $G_{Load}$ so an ideal cable length for one process may not be best for another set of conditions. While cable optimization can offer improvement, as processes and systems become increasingly complex, the technique becomes less and less effective for ensuring continuous system stability.

Figure 8:
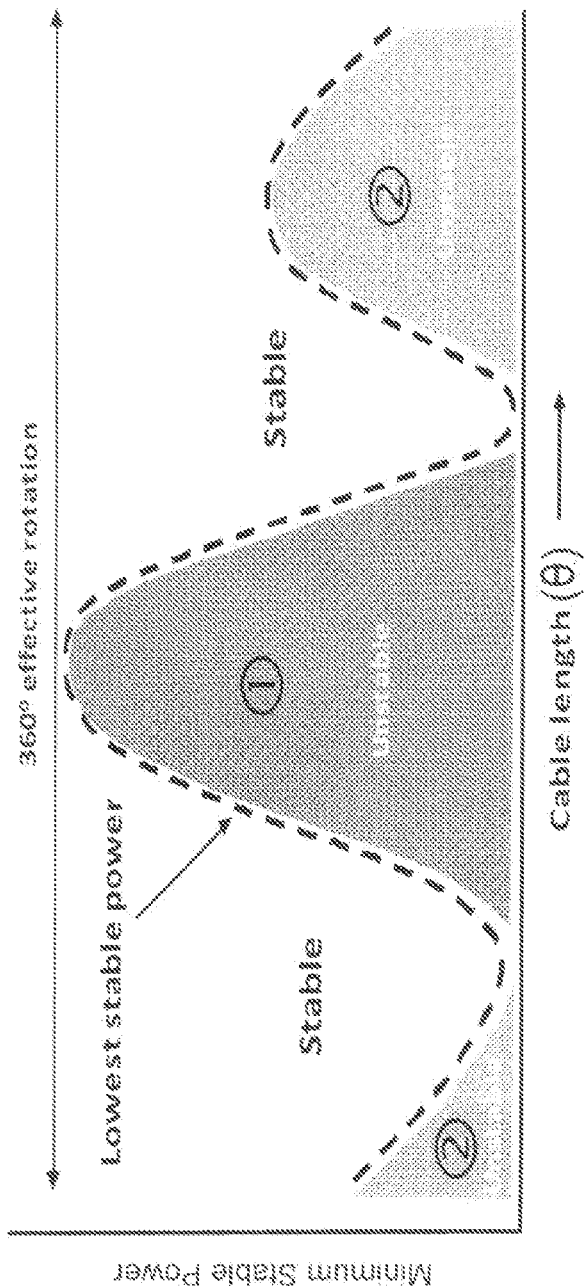
FIG. 8 is a graph depicting a typical cable length stability profile for an inductively coupled, low pressure, electronegative plasma.

Rotation of load trajectory ($\phi_{Load}$) through cable length can also be a valuable characterization technique that offers insight into the generator-plasma interaction. RF cable length can be used to rotate $\phi_{Load}$ in a controlled manner allowing for evaluation of stability margin. A practical method for accomplishing this is to incrementally add sections of transmission cable into the delivery path while measuring minimum stable power for each incremental length. FIG. 8, for example, depicts a typical cable length stability profile for an inductively coupled, low pressure, electronegative plasma. Once a total addition equivalent to 360° rotation in $\phi_{Load}$ (e.g., approximately 25 ft of standard cable at 13.56 MHz) is inserted, the stability profile is complete. This picture then repeats itself as additional cable lengths are inserted.

A key feature in the cable length stability profile is the presence of stable and unstable regions within the 360 degree $\phi_{Load}$ rotation. Some systems show a single unstable region but it is not uncommon for two stable and two unstable regions to appear. The two stable regions occur when the term cos θ in Equation 1 approaches zero at θ values of 90° and 270°. The two unstable regions occur as a result of system feedback experienced on either side of these preferred θ angles.

As shown in FIG. 8, stable, low power plasma performance can be achieved by choosing a transmission cable length within the stable regions. As mentioned above, this approach can be effective for addressing stability for a narrow set of conditions, but it is known that for processes with a multiplicity of chemistries and operating conditions, finding a single optimal cable length can become problematic.

RF frequency directly affects the electrical equivalent of cable length, and with respect to practical implementations for establishing and maintaining stability, frequency represents a more convenient method for addressing stability as compared to changing physical cable length. With a fixed cable, RF frequency can be used to rotate $\phi_{Load}$ to affect plasma stability in a similar manner to that of adjusting the physical cable length, but RF frequency adjustments may be accomplished using a parameter easily implemented into a real time feedback and control system.

Frequency Based Plasma Stabilization

Figure 9:
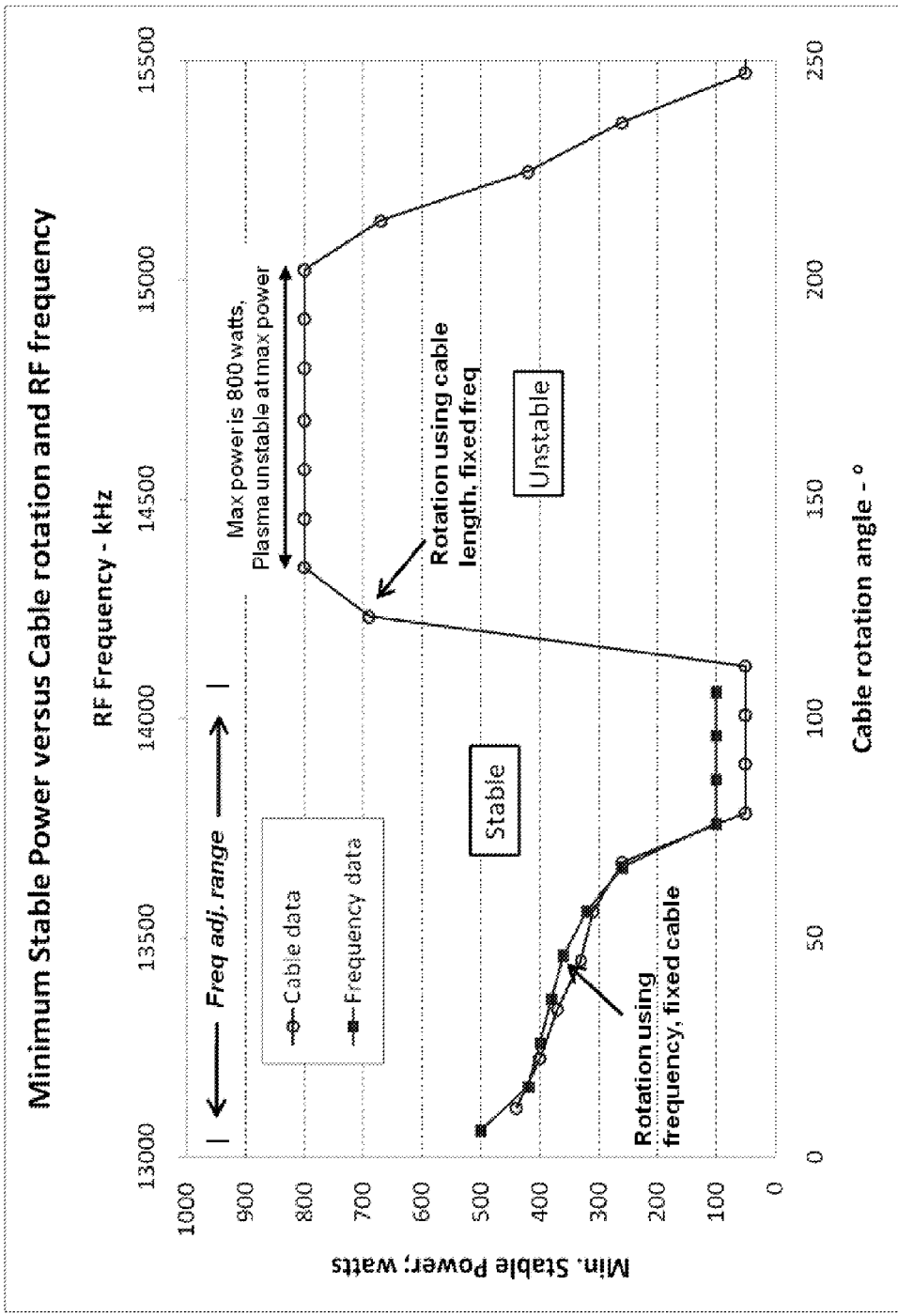
FIG. 9 is a graph depicting minimum stable power through a partial φLoad rotation in a low pressure, electronegative, inductive discharge.

FIG. 9 plots minimum stable power through a partial $\phi_{Load}$ rotation in a low pressure, electronegative, inductive discharge. The effects of both, adjusting cable length (while maintaining a fixed frequency) and adjusting frequency (while maintaining a fixed cable length) are shown. Across the tested range (limited by the frequency range of the generator used) there is very close agreement between the effects of adjusting frequency and the effects of adjusting physical cable length. This close agreement in the stability trends confirms the use of frequency as a "knob" for controlling stability of the plasma through electrical rotation of the angle $\phi_{Load}$.

Frequency tuning offers a viable means for stability control, and in many embodiments, measurement of power applied by the amplifier (e.g., amplifier 106) is carried out for detection and feedback to a control loop. As mentioned above, sensing instabilities can be a challenge. Oscillation frequencies can vary from a few 100 Hz to well over a 100 kHz. An external directional coupler feeding an oscilloscope is a proven detection method but is typically not practical for shop-floor implementation. In one embodiment, as depicted in FIG. 1, a sensor is employed to measure characteristics of power at the output of the amplifier 106, and as discussed further herein, particular data within the measurements is selected and processed and utilized to detect existing and/or imminent instabilities.

Since impedance often varies rapidly during periods of instability, monitoring short duration changes in reflection coefficient (reflected power/forward power, or Γ) is an effective way to assess stability. Standard deviation ($\sigma_\Gamma$) can be calculated periodically from a sampling of Gamma. The magnitude of $\sigma_\Gamma$ can then be used to detect the presence of an instability and quantify its severity when present. Process and control system requirements dictate the necessary sampling rate. The automated detection and correction approach discussed herein requires a sufficiently fast Γ sampling to be effective. In some implementations, forward and reflected power are sampled approximately every microsecond and ($\sigma_\Gamma$) is updated every few milliseconds.

Figure 10:
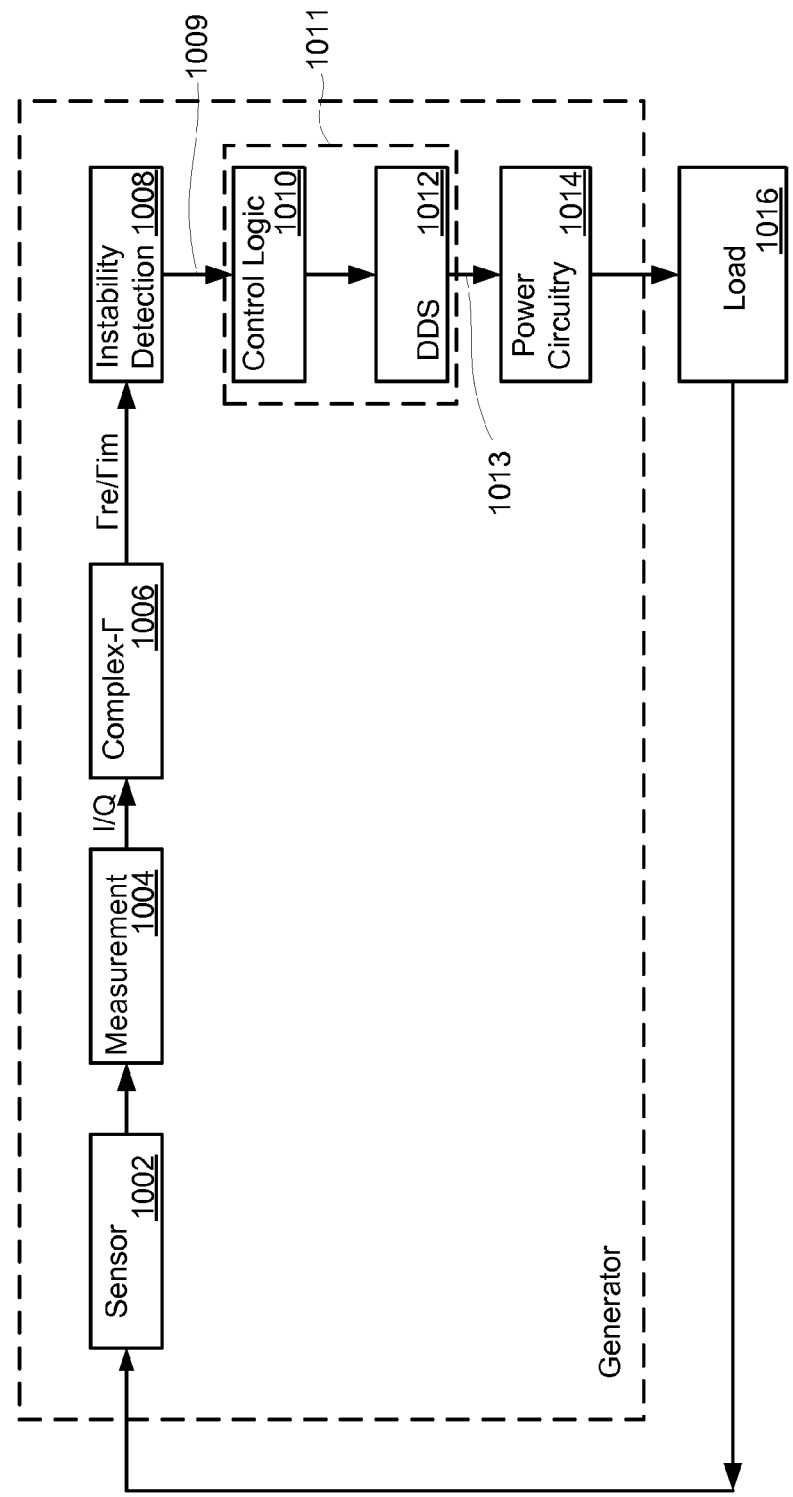
FIG. 10 is a block diagram depicting components of one embodiment a control loop for controlling frequency of an amplifier to manage plasma instabilities.

Referring next to FIG. 10, components (which may be used to realize the sensor 102, power amplifier 106, and stability controller 110 depicted in FIG. 1) of one embodiment for controlling frequency of an amplifier to manage plasma instabilities. In general, the depicted components function to identify the type of frequency oscillations (if any) that are present in the power (e.g., either low frequency or high frequency oscillations) applied by a power amplifier and modulate the frequency of the amplifier (also referred to as power circuitry) so as to prevent the instability that is associated with the detected type of frequency oscillation. As discussed above, the control loop could be adapted, in alternative embodiments, to control cable length or the match (e.g., reactive elements of the match), but frequency provides a convenient approach to align the impedance trajectories of the plasma and the power amplifier.

The measure component 1004, complex-Γ component 1006, instability detector 1008, firmware 1010, and DDS 1012 components represent exemplary components of one embodiment of the stability controller 110 depicted in FIG. 1.

It should be recognized that the depiction of these components is merely logical and not meant to be a hardware diagram; thus the depicted components may be combined or further separated. Moreover, the firmware component 1010 is not required, and generally, the components may be realized by hardware, software, firmware or a combination thereof.

The sensor 1002 depicted in FIG. 10 in many embodiments is part of a generator (e.g. within the same housing along with the amplifier) and is generally used to detect forward (FWD) and reflected (RFL) RF signals that are indicative of the power. The sensor 1002 may be realized by a variety of components including a directional coupler and VI sensor. The measurement component 1004 in this embodiment is generally configured to receive the output of the sensor 1002 and provide in-phase and quadrature measurements for both forward and reflected power. These measurements are updated on a periodic interval such as 1 μs. Exemplary sensors and techniques for processing data from a sensor are disclosed in U.S. patent application Ser. No. 12/116,375, filed May 7, 2008, entitled System, Method, and Apparatus for Monitoring Power, which is incorporated herein by reference.

For each measurement interval, the complex-Γ component 1006 calculates Γ as $V_{RFL}/V_{FWD}$, which is a division of complex numbers (I is the real part of the vector and Q is the imaginary part of the vector). A complex division is often difficult to implement with FPGA resources. Γ can also be calculated by rotating RFL with a phase that is −1 times the phase of FWD, then dividing by |FWD|. One exemplary technique that is effective for FPGA implementation was created and was implemented as follows:

1. Calculate FWDQ2+FWDI2 using FPGA multipliers, with shifts as needed to maximize utilization of significant bits.
2. Calculate K=1/(FWDQ2+FWDI2) using FPGA lookup table, with shifts as needed to maximize utilization of significant bits.
3. Using shifts as needed to maximize precision, calculate Re(Γ) as $K*I_{FWD}*I_{RFL}+K*Q_{FWD}*Q_{RFL}$, and Im(Γ) as $K*I_{FWD}*Q_{RFL}-K*Q_{FWD}*I_{RFL}$. This is derived from K times the complex product of $V_{RFL}$ and the conjugate of $V_{FWD}$. When multiplying two complex vectors, the resultant phase is additive. When multiplying with the conjugate, the resultant phase is subtractive.

Figure 11:
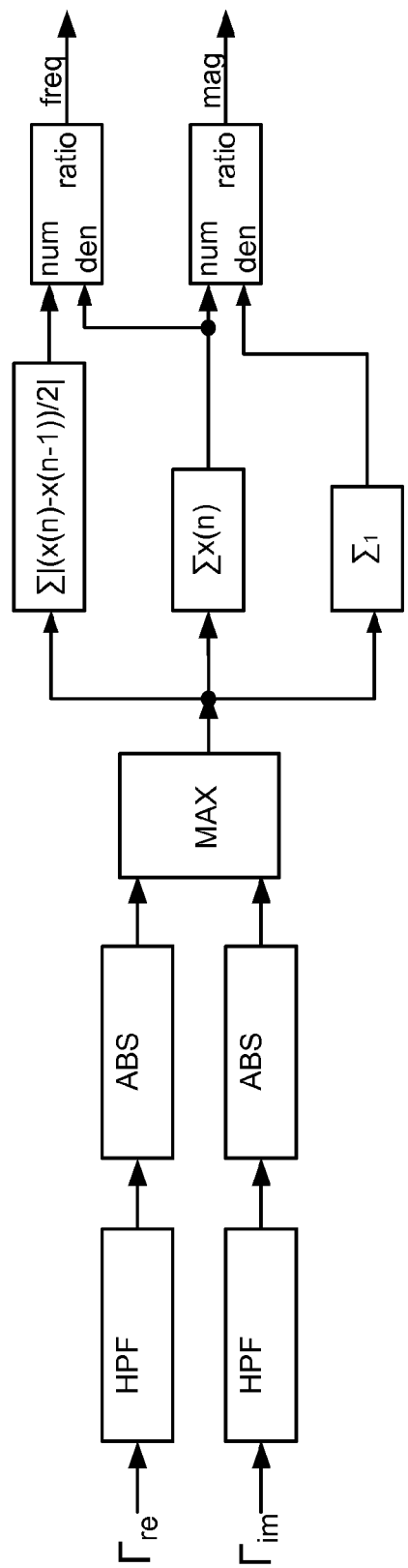
FIG. 11 is a block diagram depicting exemplary components in the instability detection component depicted in FIG. 10.

Referring next to FIG. 11, shown is a block diagram depicting exemplary components in the instability detection component 1008 depicted in FIG. 10. In general, the instability detection component 1008 provides an indication (depicted as an instability signal 1009) of the type of oscillation present in the power (and hence an indication of the type of instability in the plasma) and the magnitude of the oscillation. In this specific embodiment, the instability detection component 1008 provides an output indicative of the frequency of Γ oscillations, which is used to distinguish between high and low frequency modes, and the magnitude of the Γ oscillations.

To remove any DC component, a high-pass filter is applied to both Re(Γ) and Im(Γ), with the output corresponding to the type of oscillation of Γ (and the type of instability). As an example, the high-pass filter can be implemented as y(n)=1024*x(n)−x(n−1)− . . . −x(n−1024).

In one implementation, to save FPGA resources, the filtered Re(Γ) and Im(Γ) values are combined by selecting the maximum absolute value between the two. In alternative implementations, a design with separate frequency/magnitude detection for each parameter could also be used. Generally, the result after the max function will be a full-wave rectified sinusoid. Three calculations are applied to the signal:

1. Summation of 0.5*abs(x(n)−x(n−1)). The y(n)=x(n)−x(n−1) operation is a highpass filter with response that is somewhat linear with frequency. The response of this filter is shown below.
2. Summation of x(n). This operation provides an indication of overall energy in the signal, and is used to normalize the frequency indication. When divided by the number of samples, it is also used for the magnitude output.
3. Summation of 1. The result from this accumulator is the number of samples.

Referring back to the embodiment depicted in FIG. 10, a frequency controller 1011 is generally configured to generate a frequency control signal 1013 based upon the frequency of any instability that is present in the plasma. As depicted, the frequency controller 1011 includes a control portion 1010 (which may be implemented as instructions in connection with firmware) that periodically checks the frequency and magnitude of any instability and updates the frequency accordingly. And based upon the frequency of any instability (e.g., when the magnitude exceeds a threshold), the DDS 1012 generates a frequency control signal 1013 that alters the frequency that is output by the amplifier in the power circuitry 1014. In many implementations, to manage the stability of the plasma, the frequency of the amplifier (which is part of the power circuitry 1014) is actively controlled to provide real time trajectory rotation using Γ measurement described above.

Figures 12A, 12B:
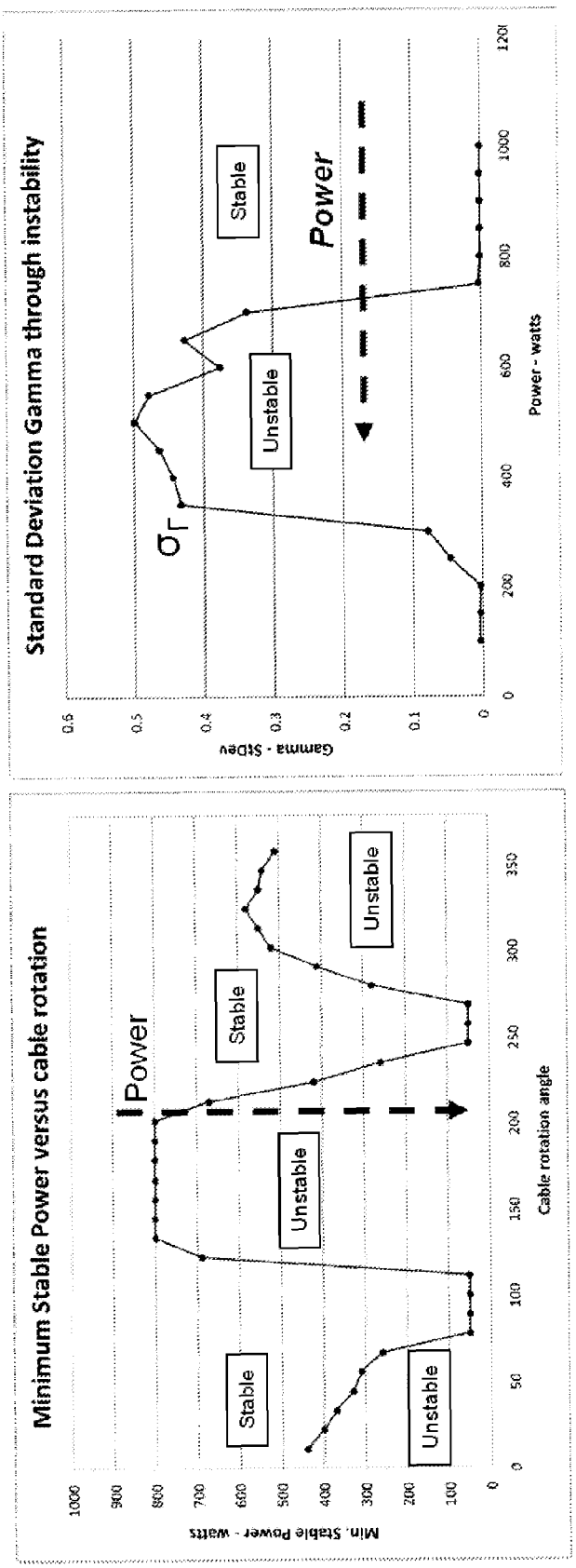
FIGS. 12A and 12B are graphs depicting minimum stable power versus cable rotation angle and Gamma versus power, respectively.

A graphical depiction of automated instability detection is shown in FIG. 12. As illustrated above, for an inductive, electronegative discharge a minimum stable power exists for each cable length. Above this power—approximately 700 watts at the highlighted cable length (FIG. 12A)—$\sigma_\Gamma$ is low, near zero (FIG. 12B). Below this threshold, $\sigma_\Gamma$ increases rapidly indicating the presence of instability, and $\sigma_\Gamma$ remains high until the inductive mode of the plasma is lost (due to inadequate power coupling) and the discharge transitions to a low density capacitive state. At the lower powers (below 200 watts) the plasma is once again stable.

Using these rapid $\sigma_\Gamma$ measurements, in many embodiments, the control loop described with reference to FIGS. 10 and 11 may be utilized to maintain stable plasma operation using frequency adjustment. When instabilities are detected, based on $\sigma_\Gamma$, the control system makes appropriate changes to frequency; thus rotating the load impedance trajectory in order to achieve a more favorable θ and regain stability.

Figures 13A, 13B:
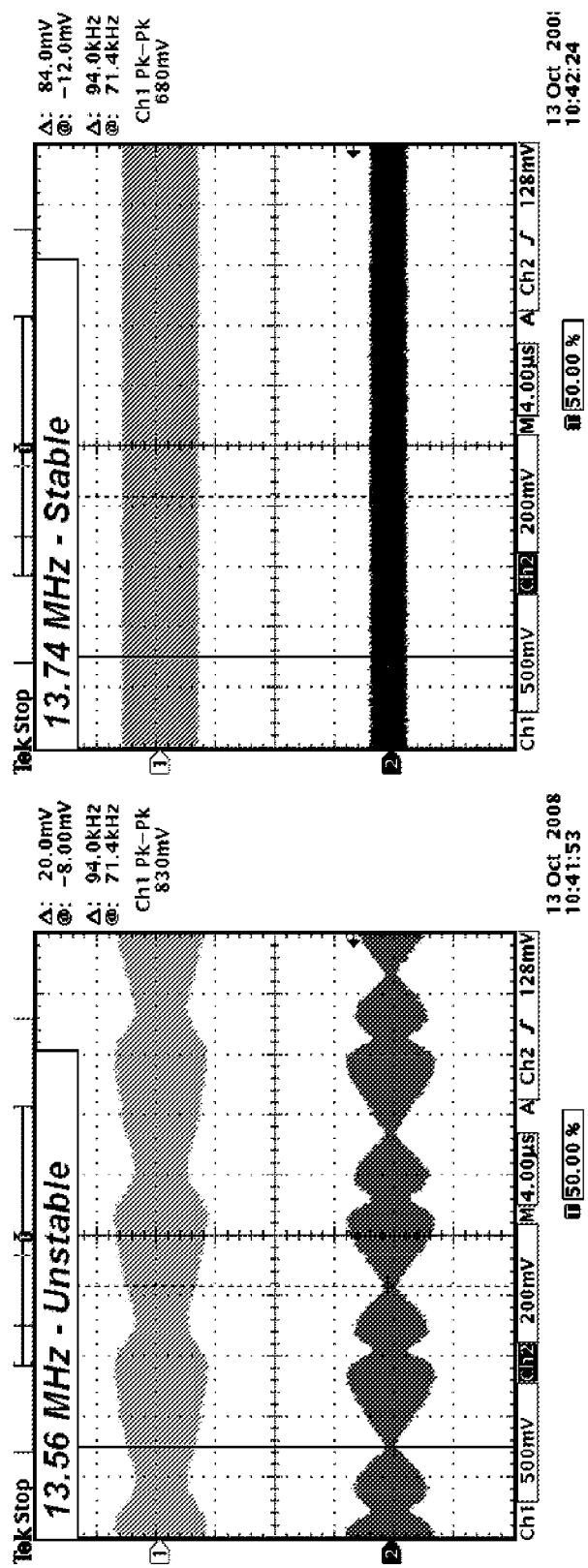
FIGS. 13A and 13B are graphs depicting forward and reflected power captured in the presence of an unstable inductive discharge at 13.56 MHz and a stable discharge restored after frequency is adjusted to 13.74 MHz, respectively.

Referring next to FIGS. 13A and 13B, the technique was applied to an inductive, electronegative discharge operating at 13.56 MHz (at a fixed cable length similar to that shown in FIG. 12). A directional coupler at the output of the generator captured the power oscillations when the unstable threshold was crossed (as depicted in FIG. 13A). Once engaged, the control loop adjusted frequency of the RF output of the amplifier (from 13.56 MHz to 13.74 MHz) to regain stability. FIG. 13B shows the resulting power traces after loop engagement, indicating a recovery to stable operation. In this case the criterion for stability was $\sigma_\Gamma$<0.04. Once $\sigma_\Gamma$ exceeded 0.04, frequency tuning was initiated. For this process the instability was corrected by a 180 kHz increase applied to the RF frequency.

An important consideration with this approach is the frequency range of the generator. A finite bandwidth in frequency establishes the limits to which θ can be affected. In the example above, the RF generator had a frequency range of approximately ±5% around 13.56 MHz. Using RG393 coaxial transmission cable, this range provides a maximum of approximately 140° of $\phi_{Load}$ rotation. Note, in FIG. 8 the frequency range tested was from 13.06 MHz-14.06 MHz, providing just over 100° of effective rotation. This finite range in frequency adjustment defines the range of stability control available from this approach. As a result some optimization in cable length may still be necessary to ensure the desired stable regions are accessible within the available range of frequency rotation.

Changes to RF frequency also impact impedance matching which can result in increased reflected power after frequency based stabilization. Some amount of reflection is not detrimental to a process if the power supply is configured to compensate and maintain delivered power (and has necessary headroom). Retuning may be necessary if a reflected power limit is reached. This can be a complication since, referring to FIG. 7, retuning can also impact $\phi_{Load}$ as seen by the generator. To avoid issues the control loops for tuning and stabilization in the above example were synchronized to avoid conflicts. By using this approach, stability can be achieved in most cases while also matching to minimum reflected power.

Low pressure, low power, electronegative plasmas are particularly prone to stability issues, some of these issues are inherent to the plasma and others result from a dynamic interaction between the plasma impedance and the power delivery system. As described, advanced features such as variable frequency, delivered power regulation and high speed impedance measurement can be used to not only detect the presence of plasma instabilities but also to suppress and avoid them.

In conclusion, the present invention provides, among other things, a method and apparatus for stabilizing plasma and generator interactions. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A method for reducing instabilities in a plasma-based processing system, the method comprising:
    applying power to a plasma with a power amplifier;
    obtaining samples indicative of an impedance of the plasma;
    determining a frequency of instability oscillations, resulting from plasma-power amplifier interaction, that are present in the plasma by analyzing the samples to identify oscillatory variations in the plasma impedance; and
    altering, based upon the frequency of instability oscillations that are present, an impedance of a load that is experienced by the power amplifier to reduce any instability oscillations in the plasma, the load experienced by the power amplifier including at least an impedance of the plasma, and altering the impedance of the load includes altering a frequency of the power that is applied to the plasma by the power amplifier.

2. The method of claim 1, wherein determining the frequency of instability oscillations includes monitoring the power that is applied by the power amplifier at an output of the power amplifier.

3. The method of claim 1, including detecting an instability in advance of determining the frequency of instability oscillations in the plasma.

4. The method of claim 1, wherein altering the impedance of the load includes altering the impedance of the load so that a vector angle of the load is closer to being orthogonal to a gradient of constant power contours of the power amplifier.

5. The method of claim 1, wherein altering the impedance of the load includes altering the impedance of the load by altering a cable length of a cable that couples power from the power amplifier to the plasma.

6. The method of claim 1, wherein altering the impedance of the load includes altering an impedance of a match network that is disposed between the power amplifier and the plasma.

7. A system for reducing instabilities in a plasma-based processing system, the system comprising:
    a power amplifier configured to apply power to a plasma processing chamber to ignite and sustain a plasma;
    a sensor configured to sense at least one characteristic indicative of an impedance of the plasma;
    a stability controller configured to obtain samples of the at least one sensed characteristic and determine a frequency of instability oscillations that are present in the plasma by analyzing the samples to identify oscillatory variations in the plasma impedance, and responsive to the frequency of instability oscillations that are present in the plasma, the stability controller controls an operating frequency of the power amplifier to control a load impedance that is experienced by the power amplifier to reduce any instability oscillations in the plasma.

8. The system of claim 7, wherein the stability controller controls an impedance of a match network, the match network affecting the load impedance.

9. The system of claim 7, wherein the stability controller provides a signal that enables a cable length to be altered based upon the control signal, the cable length affecting the load impedance.

10. The system of claim 7, wherein the sensor is a sensor selected from the group consisting of a directional coupler and a VI sensor.

11. An apparatus for reducing instabilities in a plasma-based processing system, the apparatus comprising:
    a measurement component configured to provide measurements that are indicative of an impedance of the plasma;
    an instability detection component configured to obtain samples of the measurements, determine a frequency of instability oscillations in the plasma impedance by analyzing the samples, and provide a signal indicative of the frequency of any instability oscillations that are present in the plasma; and
    a frequency controller in communication with the instability detection component, the frequency controller configured to generate, based upon the frequency of any instability oscillations, a frequency control signal which controls an output frequency of an amplifier so that the frequency of power that is output by the amplifier alters an impedance of a load experienced by the amplifier so as to reduce any instabilities in the plasma-based processing system.

12. The apparatus of claim 11, including:
    a complex-F component that performs a complex division of forward and reflected voltages that are obtained from the measurements of power from the measurement component to obtain real and imaginary components of $\Gamma$;
    wherein the instability detection component receives the real and imaginary components of $\Gamma$ and generates the signal indicative of the frequency of any instability oscillations and a signal indicative of a magnitude of the instability oscillations.

* * * * *